(12) United States Patent
Xiao et al.

(10) Patent No.: US 11,467,499 B2
(45) Date of Patent: Oct. 11, 2022

(54) SYSTEM AND METHOD OF MEASURING REFRACTIVE INDEX OF EUV MASK ABSORBER

(71) Applicant: Applied Materials, Inc., Santa Clara, CA (US)

(72) Inventors: Wen Xiao, Singapore (SG); Vibhu Jindal, San Jose, CA (US); Huajun Liu, Singapore (SG); Herng Yau Yoong, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 165 days.

(21) Appl. No.: 16/893,538

(22) Filed: Jun. 5, 2020

(65) Prior Publication Data
US 2021/0382398 A1 Dec. 9, 2021

(51) Int. Cl.
| | |
|---|---|
| *G01N 21/41* | (2006.01) |
| *G03F 7/20* | (2006.01) |
| *G03F 1/22* | (2012.01) |
| *G03F 1/54* | (2012.01) |
| *G03F 1/26* | (2012.01) |
| *G01J 1/42* | (2006.01) |
| *G01N 21/33* | (2006.01) |

(52) U.S. Cl.
CPC ............ *G03F 7/70133* (2013.01); *G01J 1/42* (2013.01); *G01N 21/33* (2013.01); *G01N 21/41* (2013.01); *G03F 1/22* (2013.01); *G03F 1/26* (2013.01); *G03F 1/54* (2013.01); *G03F 7/7015* (2013.01)

(58) Field of Classification Search
CPC ...... G03F 1/24; G03F 7/70225; G03F 7/7015; G03F 1/26; G03F 1/22; G03F 7/70133; G03F 1/54; G03F 1/66; G03F 7/70033; G01J 1/42; G01N 21/33; G01N 21/41

USPC .................. 356/132, 630, 237.2–237.6, 601
See application file for complete search history.

(56) References Cited

U.S. PATENT DOCUMENTS

| | | | |
|---|---|---|---|
| 2006/0029866 A1 | 2/2006 | Schwarzl et al. | |
| 2006/0251973 A1* | 11/2006 | Takaki | ........................ G03F 1/22 430/5 |
| 2015/0144798 A1 | 5/2015 | Shi et al. | |
| 2016/0109792 A1* | 4/2016 | Mikami | ..................... G03F 1/24 430/5 |
| 2018/0299766 A1* | 10/2018 | Tanabe | ....................... G03F 1/24 |
| 2019/0285989 A1* | 9/2019 | Enkisch | ............... G02B 5/0816 |
| 2019/0384156 A1* | 12/2019 | Tanabe | ...................... G03F 1/24 |

FOREIGN PATENT DOCUMENTS

| | | |
|---|---|---|
| JP | H11211660 | 8/1999 |
| JP | 2018180544 | 11/2018 |

OTHER PUBLICATIONS

PCT International Search Report and Written Opinion in PCT/US2021/034146 dated Sep. 17, 2021, 10 pages.
PCT International Search Report and Written Opinion in PCT/US2021/034148 dated Sep. 16, 2021, 9 pages.

* cited by examiner

*Primary Examiner* — Isiaka O Akanbi
(74) *Attorney, Agent, or Firm* — Servilla Whitney LLC

(57) ABSTRACT

Apparatus, methods and are disclosed for measuring refractive index of an absorber material used in EUV phase shift masks. The method and apparatus utilize a reference measurement and as series of reflectance measurements at a range of EUV wavelengths and thickness values for the absorber material to determine the refractive index of the absorber material.

18 Claims, 4 Drawing Sheets

SYSTEM AND METHOD OF MEASURING REFRACTIVE INDEX OF EUV MASK ABSORBER

TECHNICAL FIELD

The present disclosure relates generally to extreme ultraviolet lithography, and more particularly, to systems and methods of measuring the refractive index of an absorber of an extreme ultraviolet element.

BACKGROUND

Extreme ultraviolet (EUV) lithography (EUVL), also known as soft x-ray projection lithography, can be used for the manufacture of 0.0135 micron and smaller minimum feature size semiconductor devices. However, extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

The lens elements and mask blanks of extreme ultraviolet lithography systems include multiple alternating layers of materials reflective of EUV radiation such as molybdenum and silicon. Reflection values of approximately 65% per lens element, or mask blank, have been obtained by using substrates that are coated with multilayers that strongly reflect light within an extremely narrow ultraviolet bandpass, for example, 12.5 to 14.5 nanometer bandpass for 13.5 nanometer ultraviolet light.

One type of EUV reflective element 100, shown in FIG. 1 is known as a phase shift mask (PSM). The EUV phase shift mask (PSM) shown in FIG. 1 comprises an absorber 115 disposed on a capping layer 114 of the EUV reflective element 100. The EUV reflective element 100 can be in the form of an EUV mask blank or an extreme ultraviolet mirror. The EUV reflective element 100 includes a substrate 102, a multilayer stack 105 in the form of a Bragg reflector comprised of alternating reflective layers including a first reflective layer 106, a second reflective layer 108, and the capping layer 114. When an EUV reflective element is used in a high numerical aperture (NA) scanner, intensity (I) and phase ($\phi$) of reflected light from exposed region 100e ($I_0$ and $\phi_0$) shown as line 104 and covered areas 100c covered by the multilayer absorber 115 shown as line 103 ($I_1$ and $\phi_1$) are shown. The absorber layer 115 of the PSM not only absorbs EUV light, but also changes phase ($\phi$) of the incident EUV light. To optimize the imaging resolution of the PSM in an EUV scanner, intensity (I) and phase ($\phi$) of reflected light from exposed region 100 ($I_0$ and $\phi_0$) and covered region 100c ($I_1$ and $\phi_1$) need to be optimized, for example, the phase shift $\Delta\phi=\phi_1-\phi_0$ need to be precisely controlled to optimized value of 120°-240° (e.g. 180°). Phase shift is directly determined by refractive index n of EUV PSM absorber layer 115.

Experimental measurement of refractive index (n) of materials at the wavelength of EUV light (13.53 nm) is necessary for the development of absorber materials for EUV phase shift masks. Currently, n of materials at EUV wavelengths (e.g., 13.53 nm) is determined based on ellipsometry techniques, including a synchrotron radiation source (monochromatic light source of 13.53 nm in wavelength) and fitting of q-2q scanning spectrum. The required synchrotron radiation source is costly, and the angle-dependent measurement is time-consuming. There is a need to provide improved systems and methods to measures the refractive index (n) of EUV absorber layers.

SUMMARY

One or more embodiments of the disclosure are directed to an apparatus to measure a refractive index of an extreme ultraviolet absorber material, the apparatus comprising: a first light probe comprising a first distributed Bragg reflector which reflects extreme ultraviolet (EUV) light; a second light probe comprising a second distributed Bragg reflector which reflects EUV light; an absorber material having a thickness t between the first light probe and the second light probe, the first light probe, absorber material and the second light probe on a substrate having a surface; an EUV light source positioned at an angle θ with respect to a plane normal to a surface the substrate and configured to direct incident light toward the first light probe; a light detector positioned to detect a first light beam reflected from the first light probe and a second light beam transmitted through the absorber material and reflected from the second light probe; and a processor configured to determine the refractive index of the absorber material.

Additional embodiments of the disclosure are directed to a method of measuring the a refractive index of an extreme ultraviolet absorber material, the method comprising: positioning an EUV light source with respect to a substrate having formed on a surface of the substrate: a first light probe comprising a first distributed Bragg reflector which reflects extreme ultraviolet (EUV) light; a second light probe comprising a second distributed Bragg reflector which reflects EUV light; and an absorber material having a thickness t between the first light probe and the second light probe, the first light probe, absorber material and the second light probe on a substrate having a surface. The method further comprises directing incident light toward the first light probe, the incident light directed at an angle θ with respect to a plane normal to the surface of the substrate; detecting light with a light detector positioned to detect a first light beam reflected from the first light probe and a second light beam transmitted through the absorber material and reflected from the second light probe; and calculating the refractive index of the absorber material.

In a third aspect, a non-transitory computer-readable storage medium including instructions, that, when executed by a processor of an apparatus to measure the refractive index of an absorber material, causes the apparatus to perform the operations of: positioning an EUV light source with respect to a substrate having formed on a surface of the substrate: a first light probe comprising a first distributed Bragg reflector which reflects extreme ultraviolet (EUV) light; a second light probe comprising a second distributed Bragg reflector which reflects EUV light; and an absorber material having a thickness t between the first light probe and the second light probe, the first light probe, absorber material and the second light probe on a substrate having a surface. The operations further comprise directing incident light toward the first light probe, the incident light directed at an angle θ with respect to a plane normal to the surface of the substrate; detecting light with a light detector positioned to detect a first light beam reflected from the first light probe and a second light beam transmitted through the absorber material and reflected from the second light probe; and calculating the refractive index of the absorber material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

Figure 1:
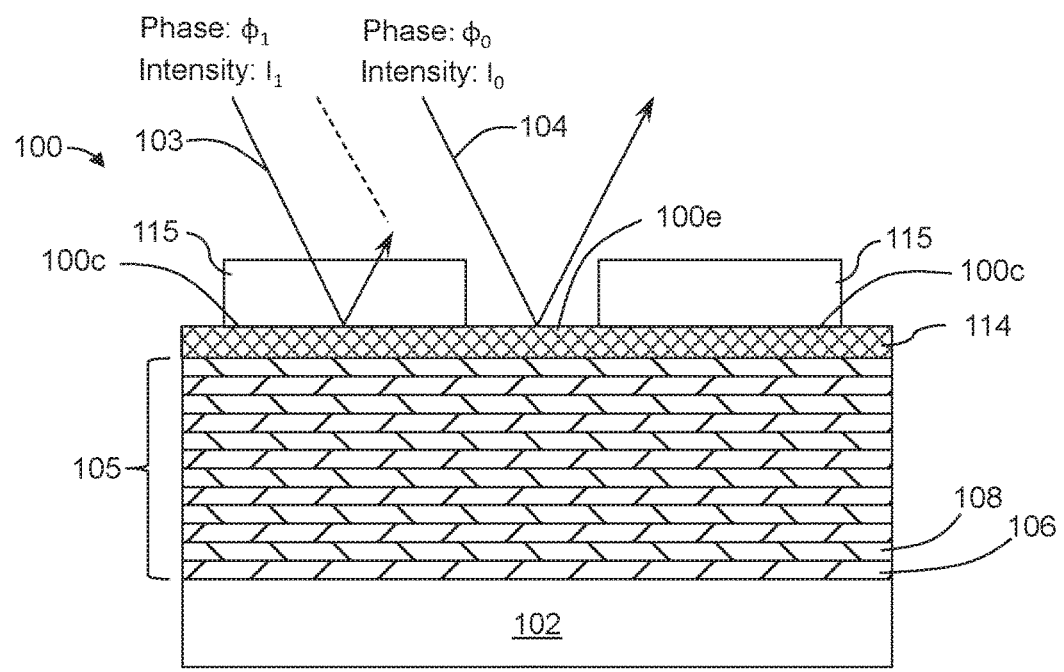
FIG. 1 illustrates an EUV reflective element according to the prior art.
Figure 2:
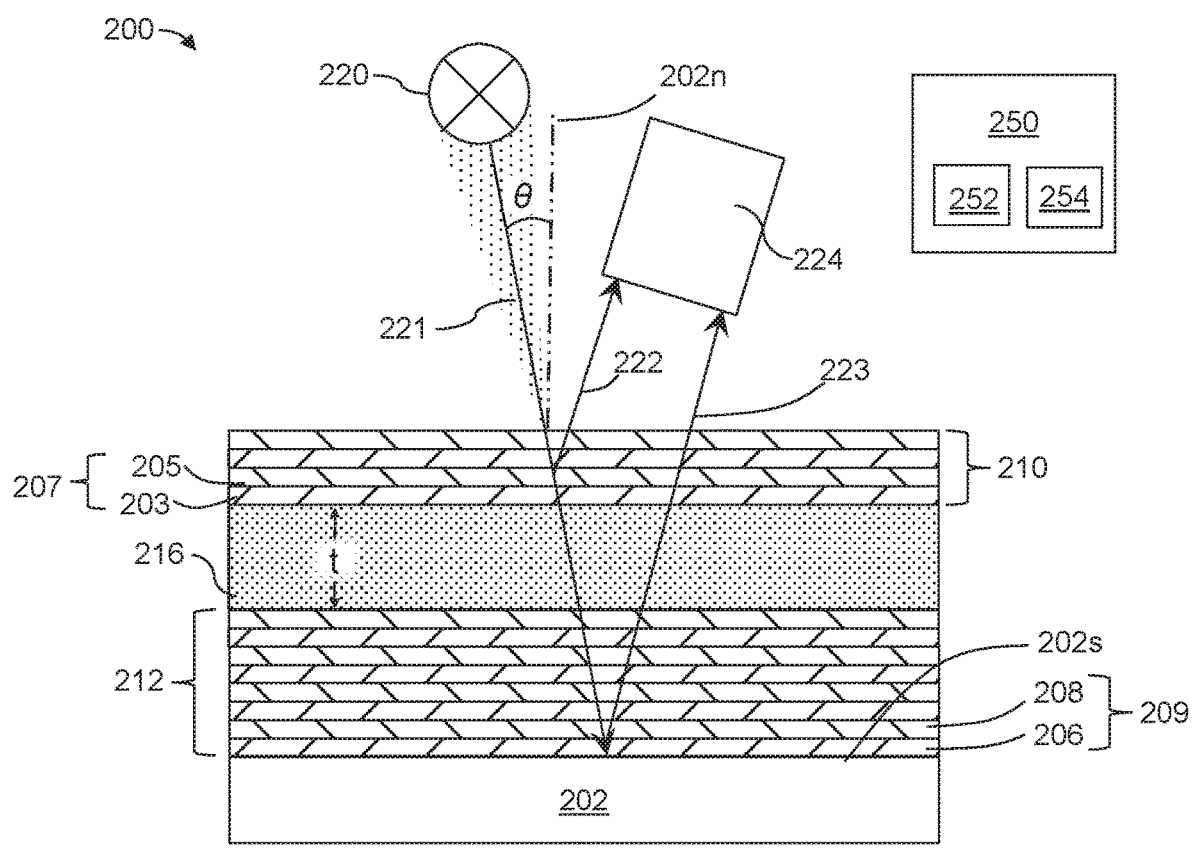
FIG. 2 schematically illustrates an embodiment of a measurement system for measuring refractive index of an absorber of an EUV reflective element.

Referring now to FIG. 2, an exemplary embodiment of a system or apparatus 200 for measuring refractive index n of an absorber material 216 at EUV wavelengths is shown. In one or more embodiments of the disclosure, the system or apparatus 200 comprises an EUV light source 220, the absorber material 216, a first light probe 210 which reflects EUV radiation and a second light probe 212 which reflects EUV radiation, a substrate 202, and a light detector 224. In the embodiment shown, the absorber material 216 is positioned between the first light probe 210 and the second light probe 212. In the embodiment shown the first light probe 210 is positioned over the absorber material 216, and the absorber material 216 is positioned over the second light probe 212. In specific embodiments, the first light probe 210 is directly above and in direct contact with the absorber material 216, the absorber material 216 is directly above and in direct contact with the second light probe 212. The second light probe is on the substrate 202 shown as being directly below and in direct contact with the second light probe 212. In specific embodiments, the absorber material 216 is sandwiched between the first light probe 210 and the second light probe. In the embodiment shown, the first light probe 210 is a top light probe and the second light probe 212 is a bottom light probe as shown in the exemplary embodiment of FIG. 2.

The EUV light source 220 is positioned such that the EUV light source 220 directs light at the first light probe 210. The light detector 224 is positioned to receive light reflected from the first light probe 210 and the second light probe 212. In the configuration shown in FIG. 2, the EUV light source 220 and the light detector 224 are positioned above the first light probe 210. However, it will be understood that the configuration shown in FIG. 2 could be reversed such that the first light probe 210 is a bottom light probe, the second light probe 212 is a top light probe, the substrate 202 is the top most structure, and the EUV light source 220 and the light detector 224 are positioned below the first light probe 210.

The EUV light source 220 can be any suitable light source that generates light. For example, the EUV light source 220 according to one or more embodiments comprises a laser-produced plasma (LPP) source, a $CO_2$ laser, or a discharge-produced plasma (DPP) source. The extreme ultraviolet light source 220 produces broadband extreme ultraviolet radiation over a range of wavelengths. For example, the extreme ultraviolet light source generates the extreme ultraviolet light comprising wavelengths ranging from 12 nm to 14.5 nm. The light detector 224 according to one or more embodiments comprises a charge-coupled device (CCD) detector or a silicon-based p-n junction photodiode. In one or more embodiments, the light detector 224 is configured to measure reflection of light intensity or reflectance as a function of wavelength. In some embodiments, the light detector 224 is configured to measure intensity of light at desired wavelength range, and may comprise a grating or other filtering mechanism to measure within the range of from 12.5 nm to 14.5 nm.

In one or more embodiments, the EUV light source 220 generates incident light 221 directed at the first light probe as shown in FIG. 2 within an EUV wavelength range, for example, in a range of from 12.5-14.5 nm. In one or more embodiments of the disclosure, the EUV light source 220 directs incident light 221 to the substrate at angle θ with respect to a plane normal to the surface 202s of the substrate 202. The angle θ according to one or more embodiments is in a range of from 1 degrees to 45 degrees, for example, from 1 degrees to 10 degrees, or from 5 degrees to 35 degrees, or from 5 degrees to 25 degrees, or from 5 degrees to 20 degrees, or from 5 degrees to 15 degrees, or 5 degrees to 10 degrees, or from 10 degrees to 30 degrees or from 10 degrees to 25 degrees or from 10 degrees to 20 degrees, or from 15 degrees to 30 degrees or from 15 degrees to 25 degrees with respect to a plane 202n normal to the surface 202s of the substrate.

In one or more embodiments of the disclosure, the substrate 202 comprises any suitable material. In one embodiment, the substrate 202 comprises a silicon wafer. In other embodiments, the substrate 202 comprises quartz or a substrate having very low thermal expansion, for example, ultra low thermal expansion glass (e.g., ULE® glass available from Corning, Inc. or Zerodur® low expansion lithium aluminosilicate glass). In one or more embodiments, the substrate surface 202s has a surface roughness of less than or equal to 0.03 nm.

In one or more embodiments of the disclosure, the second light probe 212 is disposed on a substrate 202. In exemplary embodiments of the disclosure the second light probe 212 comprises a second distributed Bragg reflector (DBR) 209 which reflects EUV light comprising wavelengths ranging from 12.5 nm to 14.5 nm. In some embodiments of the disclosure, the second light probe comprises multilayers including a range of 10-40 bilayers or 20 to 40 total layer. In an exemplary embodiment of the disclosure, the second DBR 209 comprises bilayers including a first reflective layer 206 (e.g., molybdenum (Mo)) and a second reflective layer 208 (e.g., silicon (Si)). In one or more embodiments of the disclosure, the reflective multilayers of the second distributed Bragg reflector (DBR) 209 are fabricated by deposition, such as physical vapor deposition (PVD), ion beam deposition (IBD), (chemical vapor deposition) CVD and atomic layer deposition (ALD).

The reflective multilayers of the second DBR 209 according to one or more embodiments, comprises a structure that is reflective to the extreme ultraviolet light. The multilayers include alternating reflective layers of the first reflective layer 206 and the second reflective layer 208. The first reflective layer 206 and the second reflective layer 208 can be formed from a variety of materials that reflect EUV light. In an embodiment, the first reflective layer 206 and the second reflective layer 208 are formed from silicon and molybdenum. In other embodiments, the alternating layers can be formed from other materials or have other internal structures.

The first reflective layer 206 and the second reflective layer 208 can have a variety of structures. In an embodiment, both the first reflective layer 206 and the second reflective layer 208 are formed with a single layer, multiple layers, a divided layer structure, non-uniform structures, or a combination thereof.

In an embodiment, each of the alternating reflective layers (first reflective layer 206 and second reflective layer 208) has dissimilar optical constants for the extreme ultraviolet light. The alternating layers provide a resonant reflectivity when the period of the thickness of the alternating layers is one half the wavelength of the extreme ultraviolet light. In an exemplary embodiment, for the extreme ultraviolet light at a wavelength of 13 nm, the alternating layers are about 6.5 nm thick.

The physical dimensions of the first reflective layer 206 and second reflective layer 208 of the second DBR 209 are precisely controlled to increase reflectivity. In an embodiment, the first reflective layer 206, such as a layer of silicon, has a thickness of 4.1 nm. The second reflective layer 208, such as a layer of molybdenum, has a thickness of 2.8 nm. In one or more embodiments, the thickness of the layers dictates the peak reflectivity wavelength of the second DBR 209. If the thickness of the layers is incorrect, the reflectivity at the desired wavelength 13.5 nm can be reduced.

In an embodiment, the second DBR 209 has a reflectivity of greater than 20% in the wavelength range of from 12.5 nm to 14.5 nm.

In one or more embodiments of the disclosure, the absorber material 216 is disposed directly on the second light probe 212. In some embodiments, the absorber material 216 has a refractive index (n) and thickness t and an absorption coefficient ranging from $10^5$ cm$^{-1}$ to $10^6$ cm$^{-1}$ at measured wavelengths in a range of from 12.5 nm to 14.5 nm. The absorber material 216 is configured to absorb EUV light in a wavelength range of from 12.5 to 14.5 nm. The EUV absorber material are fabricated by deposition, such as physical vapor deposition (PVD), ion beam deposition (IBD), (chemical vapor deposition) CVD and atomic layer deposition (ALD). In exemplary embodiments, the absorber material comprises tantalum or tantalum nitride.

In one or more embodiments of the disclosure, first light probe 210 is disposed on the EUV absorber material 216. In exemplary embodiments of the disclosure, the first light probe 210 comprises a first distributed Bragg reflector (DBR) 207 which reflects EUV light comprising wavelengths ranging from 12.5 nm to 14.5 nm. In some embodiments, the first light probe comprises reflective multilayers ranging from 5-20 bilayers or 10 to 40 total layers. In one or more embodiments the first DBR of first light probe 210 comprises a lower number of bilayers and multilayers than the second DBR of second light probe 212, or stated another way, the second DBR of the second light probe 212 comprises a greater number of bilayers and multilayers than the first DBR of the first light probe 210. In an exemplary embodiment of the disclosure, the first DBR 207 comprises bilayers of a first reflective layer 203 (e.g., molybdenum (Mo)) and a second reflective layer 205 (e.g., silicon (Si)). In one or more embodiments of the disclosure, the reflective multilayers of the first distributed Bragg reflector (DBR) 207 are fabricated by deposition, such as physical vapor deposition (PVD), ion beam deposition (IBD), (chemical vapor deposition) CVD and atomic layer deposition (ALD).

The reflective multilayers of the first DBR 207 according to one or more embodiments comprise a structure that is reflective to the extreme ultraviolet light. The multilayers include alternating reflective layers of the first reflective layer 203 and the second reflective layer 205. The first reflective layer 203 and the second reflective layer 314 can be formed from a variety of materials that reflect EUV light. In an embodiment, the first reflective layer 203 and the second reflective layer 205 are formed from silicon and molybdenum, respectively. Although the layers are shown as silicon and molybdenum, the alternating layers can be formed from other materials or have other internal structures.

The first reflective layer 203 and the second reflective layer 205 can have a variety of structures. In an embodiment, both the first reflective layer 203 and the second reflective layer 205 are formed with a single layer, multiple layers, a divided layer structure, non-uniform structures, or a combination thereof.

In an embodiment, each of the alternating reflective layers (first reflective layer 203 and second reflective layer 205) has dissimilar optical constants for the extreme ultraviolet light. The alternating layers provide a resonant reflectivity when the period of the thickness of the alternating layers is one half the wavelength of the extreme ultraviolet light. In an embodiment, for the extreme ultraviolet light at a wavelength of 13 nm, the alternating layers are about 6.5 nm thick.

The physical dimensions of the first reflective layer 203 and second reflective layer 205 of the first DBR 207 are precisely controlled to increase reflectivity. In an embodiment, the first reflective layer 203, such as a layer of silicon, has a thickness of 4.1 nm. The second reflective layer 205, such as a layer of molybdenum, has a thickness of 2.8 nm. In one or more embodiments, the thickness of the layers dictates the peak reflectivity wavelength of the first DBR 207. If the thickness of the layers is incorrect, the reflectivity at the desired wavelength 13.5 nm can be reduced.

In an embodiment, the first DBR 207 has a reflectivity of greater than 10% in the wavelength range of 12.5 nm to 14.5 nm. In some embodiments, reflectivity greater than 70% is achieved using low roughness layers, clean interfaces between layers, improved layer materials, or a combination thereof.

As shown in FIG. 2, the EUV light source 220 directs incident light 221 to the substrate at angle θ with respect to a plane normal to the surface of the substrate 202. A first light beam 222 is reflected from the first light probe 210 and is detected by the light detector 224. A second light beam is transmitted through the absorber 216 and is reflected from the second light probe 212 and is detected by the light detector 224.

In one or more embodiments, the system or apparatus 200 comprises a controller 250 that communicates with EUV light source and the light detector 224 via either a wired or wireless connection. The controller 250 according to one or more embodiments comprises a processor 252, a memory 254 coupled to the processor, input/output devices coupled to the processor 252, and support circuits to provide communication between the different components of the system or apparatus, namely the EUV light source 220 and the light detector 224. Processes to operate the system or apparatus 200 may generally be stored in the memory as a software routine that, when executed by the processor, causes the system or apparatus 200 to perform methods described in the present disclosure. The software routine may also be stored and/or executed by a second processor (not shown) that is remotely located from the hardware being controlled by the processor. Some or all of the methods of the present disclosure may also be performed in hardware. As such, the methods described in this disclosure are implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The memory 254 of one or more embodiments includes one or more of transitory memory (e.g., random access memory) and non-transitory memory (e.g., storage) and the memory of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

In one or more embodiments, the controller 250 executes instructions to conduct measurement of the refractive index of the absorber material 216 of the system or apparatus 200. The controller 250 sends a control signal to direct the incident light 221 from the EUV light source 220 toward the first light probe, and the light detector is activated to detect the total reflected light comprising the first light beam 222 and second light beam 223. The total reflected light comprising the first light beam 222 and the second light beam captured by the light detector 224 produces a spectrum of reflectance over a range of wavelengths for the absorber material 216 having a particular thickness t. In one or more embodiments, several measurements are obtained with the same absorber material composition and absorber material configuration sandwiched between the first light probe and the second light probe, but each measurement comprises an absorber material 216 having a different thickness t. The processor 252 executes the instructions to conduct the measurements, and the measurements are stored in the memory 254. The processor 252 then calculates the refractive index using the equation described below.

Figure 3:
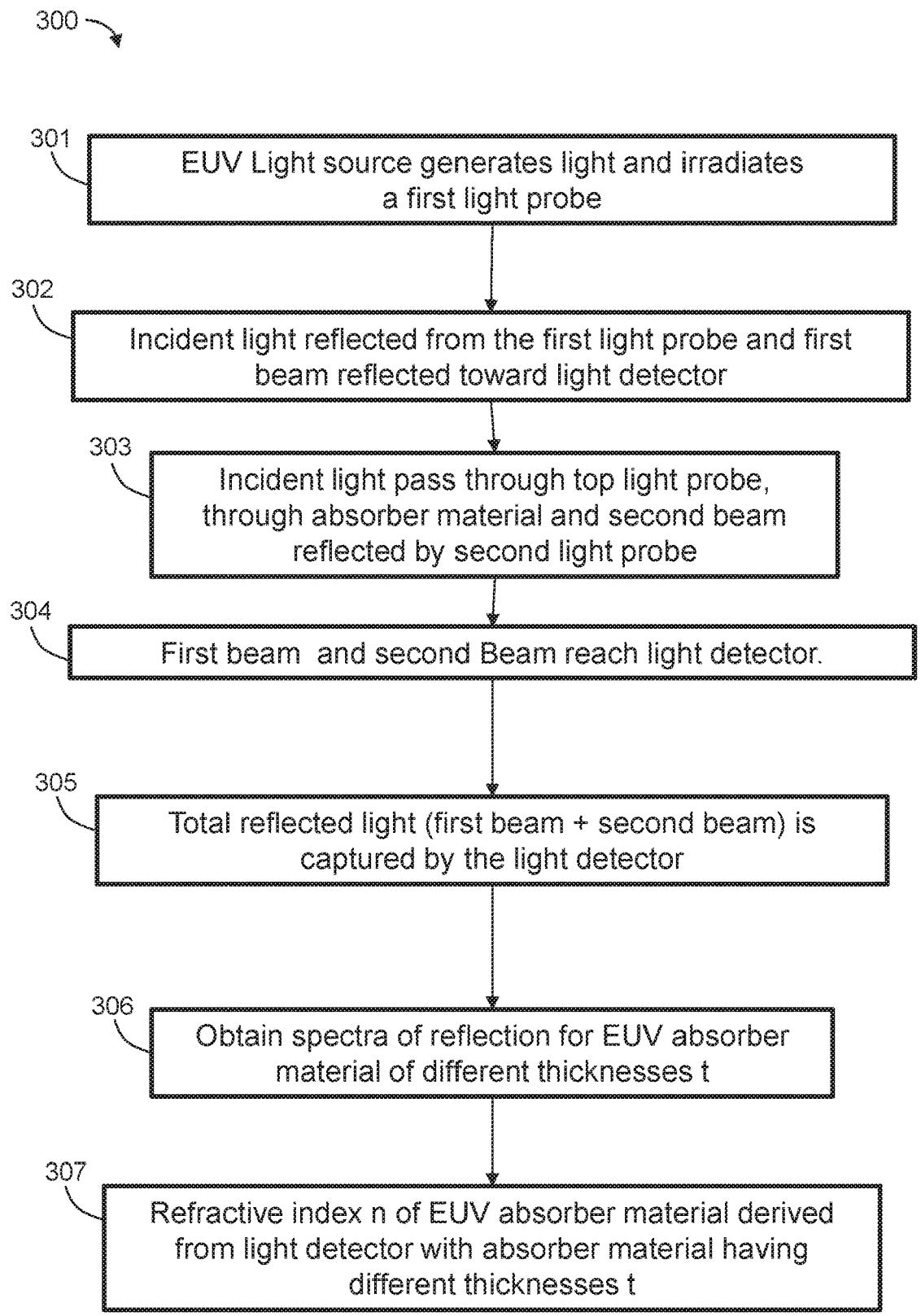
FIG. 3 illustrates an embodiment a method for measuring refractive index of an absorber of an EUV reflective element.

Referring now to FIG. 3, another aspect of the disclosure pertains to a method 300 of measuring refractive index n of an absorber material 216 configured to absorber EUV light. The EUV light in some embodiments is at a specific wavelength, for example, 13.53 nm, and in some embodiments, over a range of EUV wavelengths for example, 12.5-14.5 nm. In an exemplary embodiment of a method, at block 301, a light source 220 generates incident light 221, either at a specific wavelength or over a range of wavelengths and irradiates a first light probe 210, which is in contact with an absorber material 216, and which absorber material is in contact with a second light probe 212. At block 302, incident light 221 is reflected from the first light probe 210, and a first light beam 222 is reflected toward the light detector 224. At block 303, the incident light 221 passes through first light probe 210 and the absorber material 216 towards the second light probe 212. The incident light 221 is then reflected by second light probe 212, and a second light beam 223 is reflected toward the light detector 224. At block 304, first light beam 222 and second light beam 223 reach light detector 224. In some embodiments, the first light beam 222 and the second light beam 223 interfere with each other. At block 305, the first light beam 222 and second light beam 223 comprises of the total reflected light, and the total reflected light comprising the first light beam 222 and second light beam 223 is captured by the light detector 224. The total reflected light comprising the first light beam 222 and the second light beam captured by the light detector 224 produces a spectrum of reflectance over a range of wavelengths for the absorber material 216 having a particular thickness t. In one or more embodiments, several measurements are obtained with the same absorber material composition and absorber material configuration sandwiched between the first light probe and the second light probe, but each measurement comprises an absorber material 216 having a different thickness t. In such embodiments, after series of measurements. At block 306, a spectra of reflection is obtained for the EUV absorber material 216 having different thickness t values (t1, t2, t3 etc.), where t1, t2, and t3 are not equal. In some embodiments, measurements are made on an absorber material 215 having three different thickness values. In one or more embodiments, 3, 4, 5, 6, 7, 8, 9, 10, 11, 12, 13, 14, 15, 16, 17, 18, 19, 20, 21, 22, 23, 24, or 25 measurements are made on an absorber material, where each measurement is made on an absorber material thicknesses t that is different than the other absorber material thicknesses. At block 307, the refractive index n of EUV absorber material 116 can be derived from spectra of reflection from light detector 124 with different material thickness t.

In the preferred embodiment of the disclosure, the refractive index n of the absorber material 216 is derived by obtaining a reference periodic thickness $t_{p,n=1}$ for an absorber material with a refractive index n of 1. In an exemplary embodiment of the disclosure, the absorber material used as the reference periodic thickness is silicon.

Figure 4:
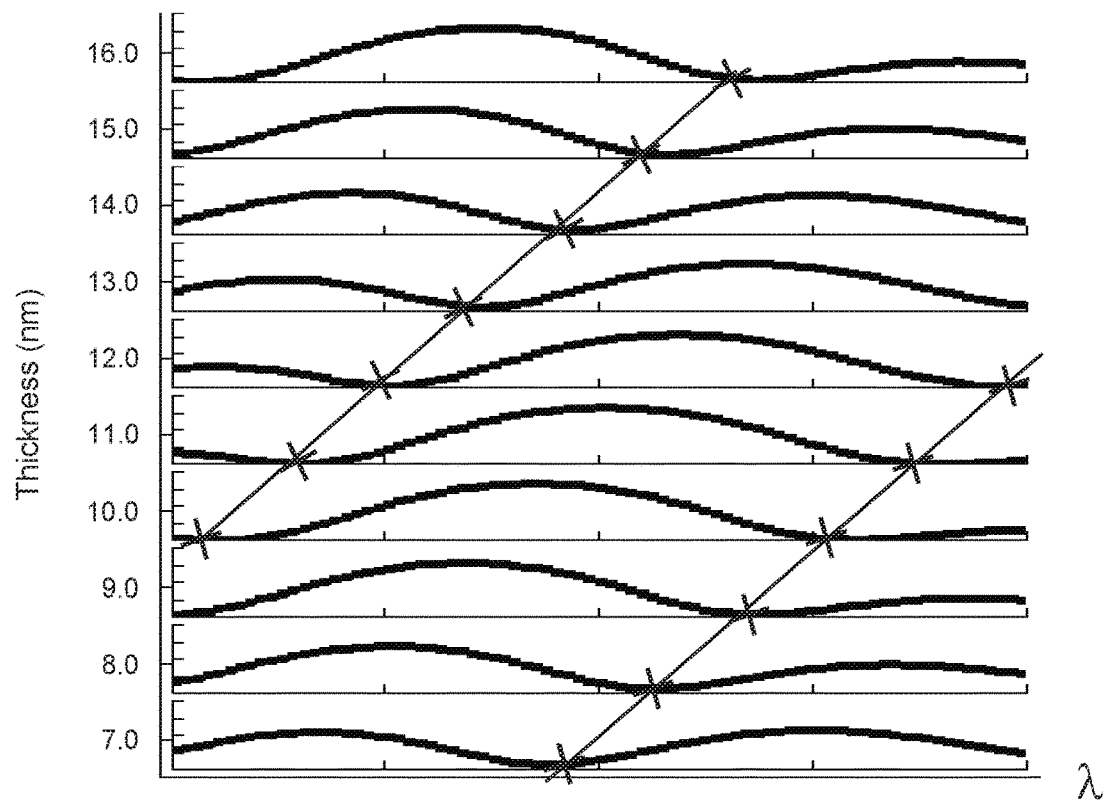
FIG. 4 is a graph of thickness versus wavelength for an absorber material that can be used according to an embodiment of the disclosure.

Referring now to FIG. 4, according to one or more embodiments of the disclosure, the method includes obtaining a periodic thickness ($t_p$) for the reference absorber material, which in some embodiments is silicon, and therefore $t_{p,Si}$ and n=1. The method according to some embodiments further comprises determining the wavelength (nm) where the spectra of reflection shows minimum light intensity for each absorber thickness t (nm) as plotted in FIG. 4. In one example, the range of thicknesses for the reference absorber material is from 7 nm to 16 nm over a wavelength range of about 12 nm to about 15 nm.

Figure 5:
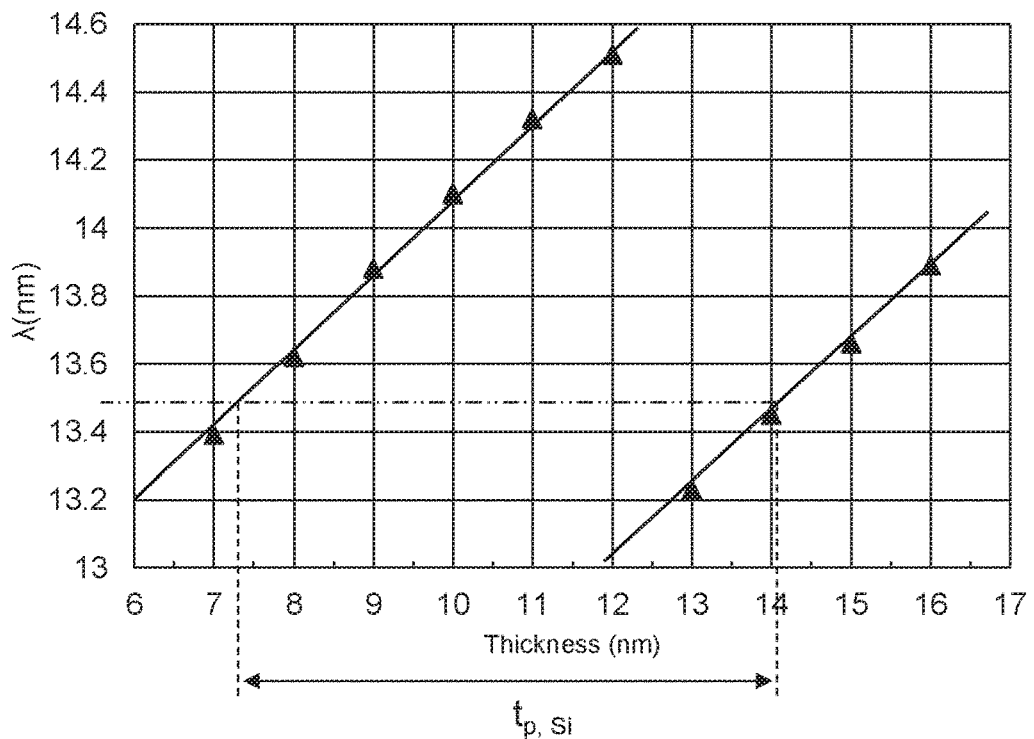
FIG. 5 is a graph of wavelength versus thickness for an absorber material that can be used according to an embodiment of the disclosure.

Then, according to one or more embodiments, as shown in FIG. 5, the wavelength over a range of wavelengths (e.g., 13 nm to 14.6 nm) is plotted as a function of thickness t for the reference absorber material, which in the embodiment show, is a silicon absorber material. Reference periodic thickness $t_{p,n=1}$ is determined by the difference of the same wavelength. In one or more embodiments, a periodic thickness $t_p$ is determined for a particular wavelength. Referring to the plot in FIG. 5, the reference periodic thickness for a silicon absorber material $t_{p,Si}$ is determined to be $t_{p,Si}$=6.818 nm at a wavelength of 13.53 nm for a reference absorber material comprised of silicon having a refractive index n=1. In the embodiment shown in FIG. 5, there is a linear relationship between the function of the wavelength over the thickness of the absorber material. Therefore, the period thickness $t_p$ can also be found at different wavelengths over a range of wavelengths (e.g. 13 nm to 14.6 nm). For example, the period thickness $t_{p,Si}$ is determined as approximately 6.818 nm by the difference of the thickness at the wavelengths of 13.65 nm or 13.8 nm.

Figure 6:
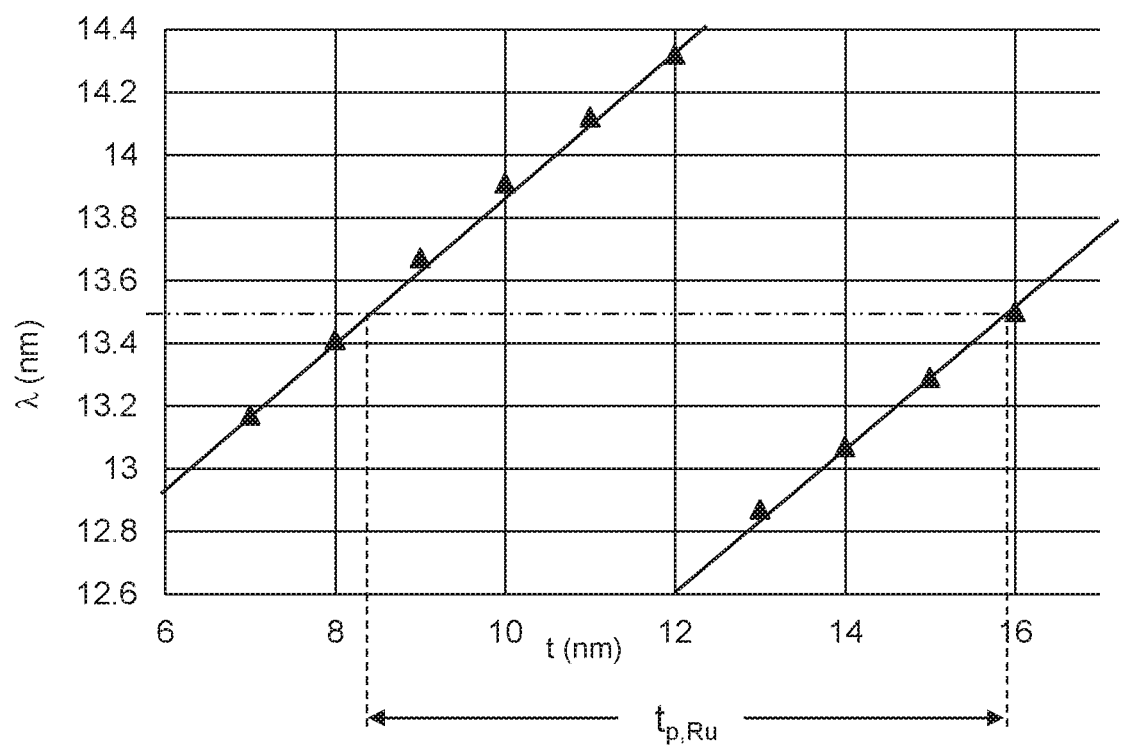
FIG. 6 is a graph of wavelength versus periodic thickness for an absorber material that can be used according to an embodiment of the disclosure.
Figure 7:
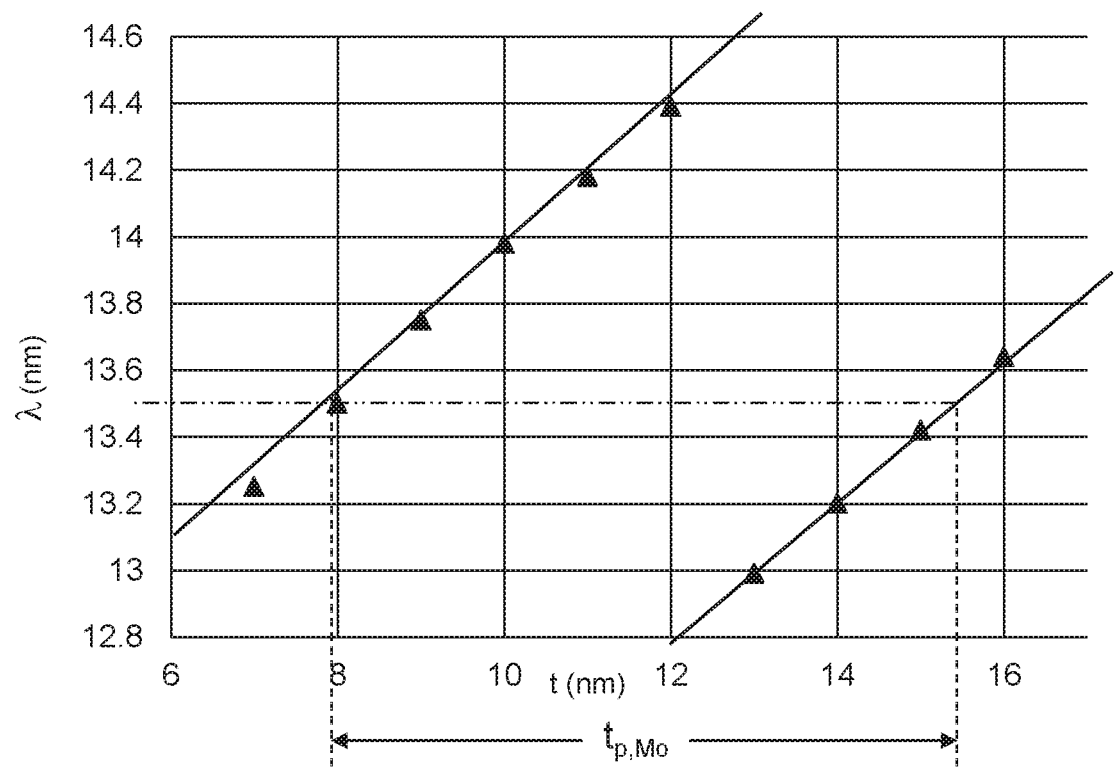
FIG. 7 is a graph wavelength versus thickness for an absorber material that can be used according to an embodiment of the disclosure.

Referring now to FIG. 6 and FIG. 7, according to one or more embodiments of the disclosure, the periodic thickness is determined for different absorber materials 216, similar to the way the periodic thickness is determined for the reference material with respect to FIGS. 4 and 5. Accordingly, a separate figure is not provided with respect to FIGS. 6 and 7, according to one or more embodiments, a person of ordinary skill in the art would utilize a graph similar to FIG. 4 and discussed above for the reference material to determine the wavelength (nm) at which the spectra of reflection shows a minimum light intensity for specific absorber materials such as the absorber materials in FIGS. 6 and 7. Thus, according to one or more embodiments of the methods disclosed herein, a plot of the spectra of versus wavelength shows a minimum light intensity for a particular absorber material having a particular thickness t (nm) value. As shown in FIG. 4, the minimum light intensity can occur at different wavelength values. Then, a plot of wavelength versus thickness is generated, and from the generated plot of wavelength versus thickness, a thickness value at a particular wavelength can be obtained or determined. For example, as shown in FIG. 6, the periodic thickness is determined for an absorber material 216 comprising ruthenium (Ru) by plotting wavelength as a function of thickness t over a wavelength range of 12.6 nm to 14.4 nm. The periodic thickness at a wavelength of 13.53 nm is obtained as or determined to be $t_{p,Ru}$=7.668 nm. As shown in FIG. 7, according to one or more embodiments, the periodic thickness is determined for an absorber material 216 comprising molybdenum (Mo) by plotting wavelength as a function of thickness t over a wavelength range of 12.6 nm to 14.4 nm. The periodic thickness at a wavelength of 13.53 nm is obtained as or determined to be $t_{p,Mo}$=7.369 nm. As shown in FIG. 6 and FIG. 7, there is a linear relationship between the function of the wavelength over the thickness of the absorber material of ruthenium (Ru) and molybdenum (Mo). Therefore, the period thickness $t_p$ is determined at different wavelengths over a range of wavelengths (e.g., 13 nm to 14.6 nm). For example, the period thicknesses of $t_{p,Ru}$ and $t_{p,Mo}$ is determined as approximately at 7.668 nm and 7.369 nm respectively by the difference in thicknesses at the wavelengths of 13.65 nm or 13.8 nm.

After the periodic thickness of particular absorber material has been determined or obtained for a particular wavelength by plotting a range of EUV wavelength as a function of thickness t, for example, over a wavelength range of 12.6 nm to 14.4 nm, the refractive index is calculated. The refractive index n of absorber material 216 is calculated using the following equation, where θ is the angle shown in FIG. 2 of the incident light 221 to the substrate with respect to a plane 202n normal to the surface 202s of the substrate 202

$$n_{material} = 1 - \frac{\lambda \times \cos(\theta)}{2} \left| \frac{1}{t_{p,Si\ (n=1)}} - \frac{1}{t_{p,material}} \right|.$$

For the exemplary absorber materials Ru and Mo, Table 1 shows small measurement discrepancy versus theoretical values for these materials

TABLE 1

| Material | Theoretical n | Measured n | Discrepancy |
|---|---|---|---|
| Ru | 0.886 | 0.894 | +0.008 |
| Mo | 0.924 | 0.929 | +0.005 |

Embodiments of the disclosure provide a system or apparatus and a method to measure refractive index n of absorber materials at EUV wavelengths (e.g. from 12.5 to 14.5 nm), which can be used for the manufacture of EUV PSM. Embodiments address one or more problems associated with current measurement systems and methods for measuring refractive index n of materials at EUV wavelength, which tend to involve high cost and are time-consuming, for example, requiring a system of synchrotron radiation source to produce monochromatic EUV light and angle-dependent measurement. Embodiments of the disclosure provide cost-effective apparatus, system and method using a compact broadband EUV light source and a relatively quick, fixed angle measurement. The system and method provide an accurate measurement of refractive index for EUV absorber materials. The extreme ultraviolet light source produces broadband extreme ultraviolet radiation over a range of wavelengths. For example, the extreme ultraviolet light source generates the extreme ultraviolet light having wavelengths ranging from 12.5 nm to 14.5 nm.

The methods described above can be executed by a non-transitory computer-readable storage medium including instructions, that, when executed by the processor 252 of the controller 250 of the system or apparatus 200, the processor 252 of the controller 250 of the system or apparatus 200 causes the system or apparatus 200 to perform the methods described immediately above.

For example, in one embodiment, a non-transitory computer readable storage medium includes instructions that causes a processor 252 of a controller of the system or apparatus 200 causes the system or the apparatus 200 to send a control signal to direct the incident light 221 from the EUV light source 220 toward the first light probe, and the light detector is activated to detect the total reflected light comprising the first light beam 222 and second light beam 223. The total reflected light comprising the first light beam 222 and the second light beam captured by the light detector 224 produces a spectrum of reflectance over a range of wavelengths for the absorber material 216 having a particular thickness t. In one or more embodiments, several measurements are obtained with the same absorber material composition and absorber material configuration sandwiched between the first light probe and the second light probe, but each measurement comprises an absorber material 216 having a different thickness t. The processor 252 executes the instructions to conduct the measurements, and the measurements are stored in the memory 254. The processor 252 then calculates the refractive index n of absorber material 216 using the following equation, where θ is the angle shown in FIG. 2 of the incident light 221 to the substrate with respect to a plane 202n normal to the surface 202s of the substrate 202

$$n_{material} = 1 - \frac{\lambda \times \cos(\theta)}{2} \left| \frac{1}{t_{p,Si\ (n=1)}} - \frac{1}{t_{p,material}} \right|,$$

where $n_{material}$ is the measured refractive index of the material, λ is wavelength in nm, $t_{p,\ Si\ (n=1)}$ is a reference periodic thickness $t_{p,n=1}$ for a silicon absorber material with a refractive index n of 1 at the wavelength λ and $t_{p,\ material}$ is the thickness of the material measured.

Processes may generally be stored in the memory as a software routine that, when executed by the processor, causes the system or apparatus 200 to perform methods of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. An apparatus to measure a refractive index of an extreme ultraviolet absorber material, the apparatus comprising:
   a first light probe comprising a first distributed Bragg reflector which reflects extreme ultraviolet (EUV) light;
   a second light probe comprising a second distributed Bragg reflector which reflects EUV light;
   an absorber material having a thickness t between the first light probe and the second light probe, the first light probe, absorber material and the second light probe on a substrate having a surface;
   an EUV light source positioned at an angle θ with respect to a plane normal to a surface of the substrate and configured to direct incident light toward the first light probe;
   a light detector positioned to detect a first light beam reflected from the first light probe and a second light beam transmitted through the absorber material and reflected from the second light probe; and
   a processor configured to determine the refractive index of the absorber material the refractive index derived from a periodic thickness of a reference absorber material and a periodic thickness of the absorber material.

2. The apparatus of claim 1, wherein the first distributed Bragg reflector comprises reflective multilayers and the second distributed Bragg reflector comprises reflective multilayers, and the second distributed Bragg reflector comprises a greater number of reflective multilayers than the first distributed Bragg reflector.

3. The apparatus of claim 2, wherein the reflective multilayers of the first distributed Bragg reflector comprises a range of from 5-20 bilayers and the reflective multilayers of the second distributed Bragg reflector comprise a range of 10-40 bilayers.

4. The apparatus of claim 3, wherein the bilayers comprises alternating layers of molybdenum and silicon.

5. The apparatus of claim 1, wherein the processor is part of a controller that controls the EUV light source to direct EUV light at the first light probe over a range of EUV wavelengths and controls the light detector to receive the first light beam and the second light beam over the range of EUV wavelengths for the reference absorber material and the absorber material.

6. The apparatus of claim 5, wherein the range of EUV wavelengths include a range of from 12.5 nm to 14.5 nm.

7. The apparatus of claim 6, wherein the processor determines the refractive index of the absorber material based on an equation $$n_{material} = 1 - \frac{\lambda \times \cos(\theta)}{2} \left| \frac{1}{t_{p,Si\,(n=1)}} - \frac{1}{t_{p,material}} \right|$$

where $n_{material}$ is the measured refractive index of the absorber material, $\lambda$ is wavelength in nm, $t_{p,\,Si(n=1)}$ is a reference periodic thickness $t_{p,n=1}$ for a silicon absorber material with a refractive index n of 1 at the wavelength $\lambda$ and $t_{p,\,material}$ is the thickness of the absorber material.

8. The apparatus of claim 7, wherein $\theta$ is in a range of from 5 degrees to 20 degrees.

9. A method of measuring a refractive index of an extreme ultraviolet absorber material, the method comprising:
positioning an EUV light source with respect to a substrate having formed on a surface of the substrate:
a first light probe comprising a first distributed Bragg reflector which reflects extreme ultraviolet (EUV) light;
a second light probe comprising a second distributed Bragg reflector which reflects EUV light; and
an absorber material having a thickness t between the first light probe and the second light probe, the first light probe, absorber material and the second light probe on a substrate having a surface;
directing incident light toward the first light probe, the incident light directed at an angle $\theta$ with respect to a plane normal to the surface of the substrate;
detecting light with a light detector positioned to detect a first light beam reflected from the first light probe and a second light beam transmitted through the absorber material and reflected from the second light probe;
obtaining a periodic thickness of the reference absorber material; and
calculating the refractive index of the absorber material.

10. The method of claim 9, further comprising measuring light intensity received by the light detector over a range of EUV wavelengths and a range of reference absorber material thickness values for a reference absorber material having a known refractive index.

11. The method of claim 10, wherein the range of EUV wavelengths ranges from 12.5 nm to 14.5 nm.

12. The method of claim 10, further comprising measuring light intensity of the absorber material over the range of EUV wavelengths and a range of absorber thickness values.

13. The method of claim 12, further comprising obtaining a periodic thickness of the absorber material.

14. The method of claim 13, wherein the periodic thickness of the absorber material and the periodic thickness of the reference absorber material is obtained using at least 5 thickness values.

15. The method of claim 13, wherein the reference absorber material comprises silicon.

16. The method of claim 13 wherein calculating the refractive index of the absorber material utilizes the periodic thickness of the reference absorber material and the absorber material.

17. The method of claim 13, wherein calculating the refractive index of the absorber material utilizes an equation $$n_{material} = 1 - \frac{\lambda \times \cos(\theta)}{2} \left| \frac{1}{t_{p,Si\,(n=1)}} - \frac{1}{t_{p,material}} \right|$$

where $n_{material}$ is the measured refractive index of the absorber material, $\lambda$ is wavelength in nm, $t_{p,\,Si(n=1)}$ is a reference periodic thickness $t_{p,n=1}$ for a silicon absorber material with a refractive index n of 1 at the wavelength $\lambda$ and $t_{p,\,material}$ is the thickness of the absorber material.

18. A non-transitory computer-readable storage medium including instructions, that when executed by a processor of an apparatus to measure the refractive index of an absorber material, causes the apparatus to perform operations of:
positioning an EUV light source with respect to a substrate having formed on a surface of the substrate:
a first light probe comprising a first distributed Bragg reflector which reflects extreme ultraviolet (EUV) light;
a second light probe comprising a second distributed Bragg reflector which reflects EUV light; and
an absorber material having a thickness t between the first light probe and the second light probe, the first light probe, absorber material and the second light probe on a substrate having a surface;
directing incident light toward the first light probe, the incident light directed at an angle $\theta$ with respect to a plane normal to the surface of the substrate;
detecting light with a light detector positioned to detect a first light beam reflected from the first light probe and a second light beam transmitted through the absorber material and reflected from the second light probe;
obtaining a periodic thickness of the reference absorber material; and
calculating the refractive index of the absorber material.

* * * * *

UNITED STATES PATENT AND TRADEMARK OFFICE
CERTIFICATE OF CORRECTION

PATENT NO. : 11,467,499 B2
APPLICATION NO. : 16/893538
DATED : October 11, 2022
INVENTOR(S) : Wen Xiao et al.

Page 1 of 1

It is certified that error appears in the above-identified patent and that said Letters Patent is hereby corrected as shown below:

In the Specification

•Column 11, Line 38, replace "A" after "material," and before "is" with "λ".

Signed and Sealed this
Sixth Day of December, 2022

Katherine Kelly Vidal
*Director of the United States Patent and Trademark Office*